United States Patent [19]
Mai et al.

[11] Patent Number: 5,672,211
[45] Date of Patent: Sep. 30, 1997

[54] APPARATUS FOR DEPOSITING A THIN LAYER ON A SUBSTRATE BY LASER PULSE VAPOR DEPOSITION

[76] Inventors: Hermann Mai, Wallstrasse 21, 01067 Dresden; Reiner Dietsch, Fr.-Hegel-Strasse 19, 01187 Dresden; Klaus Schubert, Schulstrasse 1, 01728 Possendorf, all of Germany

[21] Appl. No.: 691,568

[22] Filed: Aug. 2, 1996

Related U.S. Application Data

[62] Division of Ser. No. 478,861, Jun. 7, 1995, Pat. No. 5,578,350, which is a continuation of Ser. No. 230,792, Apr. 21, 1994, abandoned, which is a continuation-in-part of Ser. No. 838,816, Mar. 25, 1992, abandoned.

[30] Foreign Application Priority Data

| Jul. 3, 1990 | [DE] | Germany | H01L/342 455 4 |
| Jul. 3, 1990 | [DE] | Germany | H01L/342 456 2 |
| Jun. 27, 1991 | [DE] | Germany | PCT/DE91/00533 |

[51] Int. Cl.$^6$ ..................... C23C 14/00
[52] U.S. Cl. ........................ 118/726
[58] Field of Search ........................ 118/726

[56] References Cited

U.S. PATENT DOCUMENTS 5,084,300  1/1992  Zander ................... 427/597

*Primary Examiner*—Richard Bueker
*Attorney, Agent, or Firm*—Evenson, McKeown, Edwards & Lenahan P.L.L.C.

[57] ABSTRACT

A method for depositing a thin layer on a substrate by laser pulse vapor deposition provides a substantially cylindrical target having a cylinder axis and a curved target surface. A pulsed laser beam is generated having an initial path section and an initial path section axis and is capable of producing a plasma plume from the target when the pulsed laser beam impinges on the curved target surface. A first mirror located between the target and the initial path section of the laser beam is provided having a plurality of reflective interior surfaces and a first mirror axis substantially coincident with an initial path section axis of the laser beam. The laser beam is deflected so as to impinge on the reflective interior surface of the first mirror and subsequently to be reflected and to impinge on the curved target surface by controlling a plane reflective mirror that intersects the first mirror axis and is located on a side of the first mirror opposite from the target. The plane reflective mirror is tilted at an angle to the laser beam axis and is rotatable about a rotation axis substantially coincident with the first mirror axis. The laser beam is focussed on a center of the target to produce the plasma plume on the curved target surface. The plasma plume is moved on the curved target surface over a track by moving a position where the laser beam impinges on the reflective interior surface of the first mirror step-by-step rotation of the plane reflective mirror about the rotation axis, with a thin layer being deposited with a substantially uniform thickness on the substrate by contact of the plasma plume with the substrate. The first mirror includes a plurality of plane mirrors connected in a cylindrical manner.

22 Claims, 7 Drawing Sheets

APPARATUS FOR DEPOSITING A THIN LAYER ON A SUBSTRATE BY LASER PULSE VAPOR DEPOSITION

This is a divisional application of application Ser. No. 08/478,861, filed Jun. 7, 1995, now Pat. No. 5,578,350 which is a Continuation application of the application Ser. No. 08/230,792 filed Apr. 21, 1994 (now abandoned) which is a Continuation-in-Part application of application No. 07/838,816 filed Mar. 25, 1992 (now abandoned).

BACKGROUND AND SUMMARY OF THE INVENTION

The present invention relates to the field of optics, particularly X-ray optics, and microelectronics. More particularly, the present invention relates to laser pulse vapor deposition (LPVD) of thin and very thin layers on a substrate.

According to WP C23 C/338 176 8 DD, a target having a curved surface is exposed to a laser beam which is fixed in position. The target having the curved surface is displaced from a center position $X_0$ along an X axis in uniform steps $\Delta X$ in both directions on the X axis so that a plasma plume generated when the pulsed laser beam strikes the target and propagated in a radial direction from the curved target can brush over the surface of a substrate positioned near the target. The target is also displaced along a Y axis so that the entire surface of the substrate is exposed to a maximum intensity of the plasma plume.

The disadvantages of this above-described prior art method include formation of a deposited layer on the substrate having a non-uniform thickness, since the deposition rate on a portion of the substrate surface positioned opposite the center of the target is greater than on those portions of the substrate surface opposite the edge regions of the target, and also because of a change in target curvature due to irregular target cutting by the pulsed laser beam. The reason for both of the latter effects is that the laser beam output density at the target changes as a function of the displacement of the target from the center position $X_0$. This change in the laser beam output density at the target is due to the increase in size of the target surface area element where the pulse laser beam impinges due to target surface curvature as the displacement from the center position $X_0$ increases.

SUMMARY OF THE INVENTION

An object of the present invention is to provide a method of depositing a thin layer on a substrate by laser pulse vapor deposition (LPVD) in which no irregularities occur in the deposited layer thickness distribution and a uniform substrate coating occurs, and the symmetry of the substrate is maintained.

Another object of the present invention is a method of depositing a thin layer on a substrate by laser pulse vapor deposition (LPVD) in which changes in pulsed laser beam output density at the surface of a curved target during shift of the target along a line from a center position $X_0$ are prevented or compensated for.

According to one embodiment of the invention the method for depositing a thin layer on a substrate by laser pulse vapor deposition, comprises the steps of:

a) providing a substantially cylindrical target having a cylinder axis and a curved target surface;

b) generating a pulsed laser beam having an initial path section and an initial path section axis and capable of producing a plasma plume from the target when the pulsed laser beam impinges on the curved target surface;

c) orienting the target so that the cylinder axis of the target substantially coincides with the axis of the initial path section of the laser beam;

d) providing a first mirror located between the target and the initial path section of the laser beam, said first mirror having a reflective interior surface and a first mirror axis substantially coincident with the initial path section axis of the laser beam;

e) deflecting the laser beam so as to impinge on the reflective interior surface of the first mirror and subsequently to be reflected and to impinge on the curved target surface by providing and controlling a plane reflective mirror that intersects the first mirror axis and is located on a side of the first mirror opposite from the target, said plane reflective mirror being tilted at an angle to the laser beam axis and rotatable about a rotation axis substantially coincident with the first mirror axis;

f) focussing the laser beam on a center of the target to produce the plasma plume on the curved target surface;

g) moving the plasma plume generated in step f) on the curved target surface over a track of predetermined length by moving a position where the laser beam impinges on the reflective interior surface of the first mirror by rotating the plane reflective mirror about said rotation axis in a step-by-step manner; and h) depositing a thin layer on a substrate by positioning the substrate so that the plasma plume contacts the substrate in all of said positions of said plasma plume to form the thin layer with a substantially uniform thickness on the substrate;

wherein the first mirror includes a plurality of plane mirrors connected in a cylindrical manner.

In certain embodiments, the method also includes the step of displacing the target along the first mirror axis to move the focussed laser beam to a different cutting track on the curved target.

In certain embodiments the first mirror is a plane mirror that moves on a cylindrical path synchronous to the rotation of the plane reflective mirror. This synchronous movement of the first mirror causes the laser beam to irradiate the different target surface areas from different respective angles.

The amount of angular rotation of the plane mirror can be changed in each of the steps during the rotating so that a desired thickness distribution is obtained for the thin layer formed on the substrate. The increase in magnitude of the target surface area element irradiated by the laser beam with increasing displacement of the target from the center position is prevented by the method according to the present invention, since the laser beam is deflected by the mirrors to irradiate the different target surface area from different respective angles. Accordingly there is no longer a decrease in the laser beam output density as a function of displacement of the target from the center position $X_0$. Furthermore this method prevents a defocussing of the system during deposition.

In another embodiment of the invention the laser beam is focussed on a curved target to generate a plasma plume. A substrate is positioned so as to be contacted by the plasma plume to form a deposited layer on the substrate. The target is then displaced so that the focussed laser beam is moved along a track on the curved surface of the target but the decrease in laser beam output density at the target surface caused by increase in the target surface area element exposed to laser beam radiation is compensated for by changing the number of laser pulses per target point or by changing the step size ΔX along the track. Defocussing of the system is prevented by additionally changing the distance between the lens focussing the laser beam and the target by moving the target away from the lens in a Z direction.

Other objects, advantages and novel features of the present invention will become apparent from the following detailed description of the invention when considered in conjunction with the accompanying drawings.

DETAILED DESCRIPTION OF THE DRAWINGS

Figure 1:
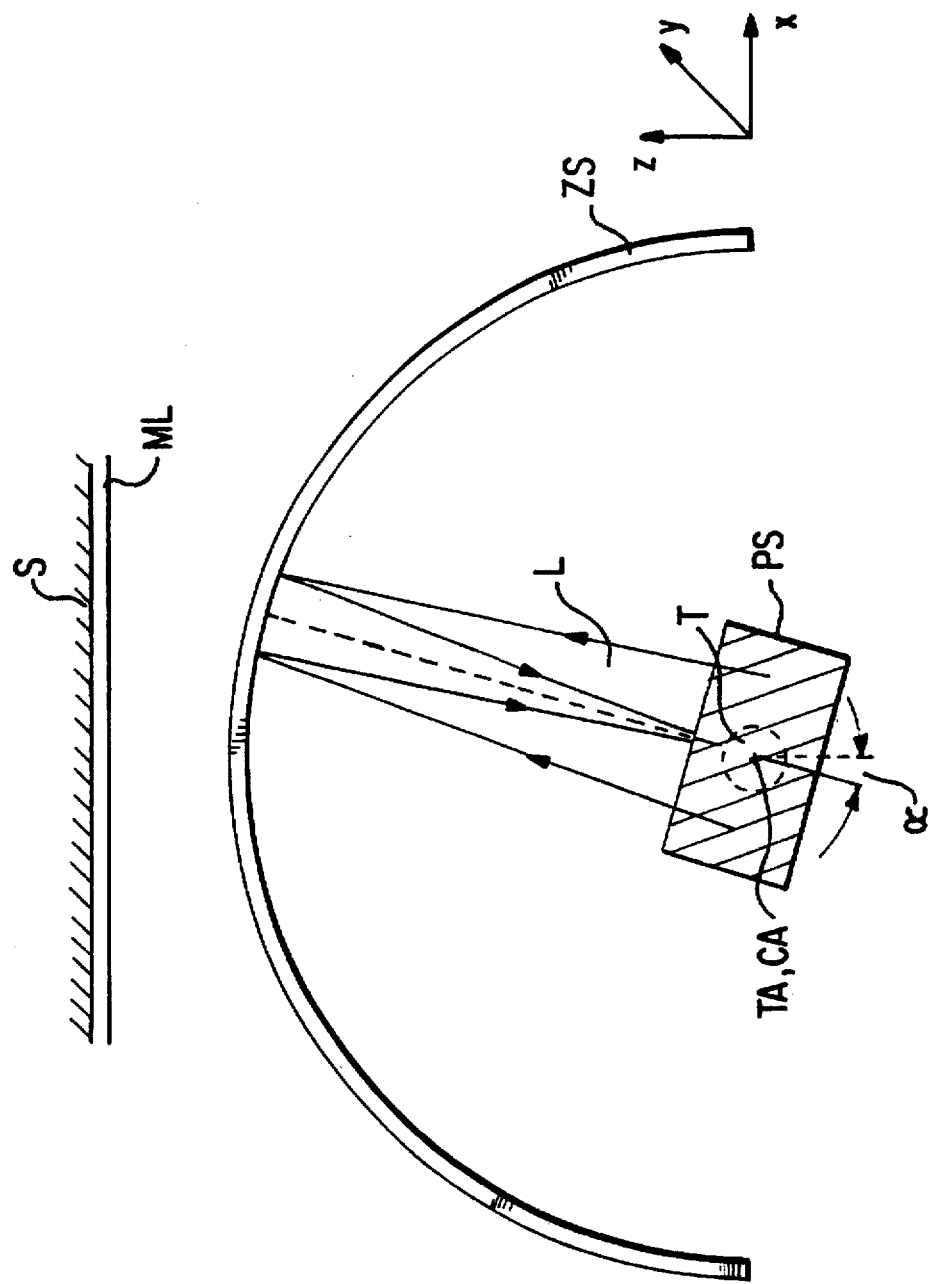
FIG. 1 is a schematic end view of an apparatus for performing a first embodiment of the method of depositing a thin layer by laser pulse vapor deposition according to an embodiment of the invention with some parts omitted from the view for simplicity.
Figure 2:
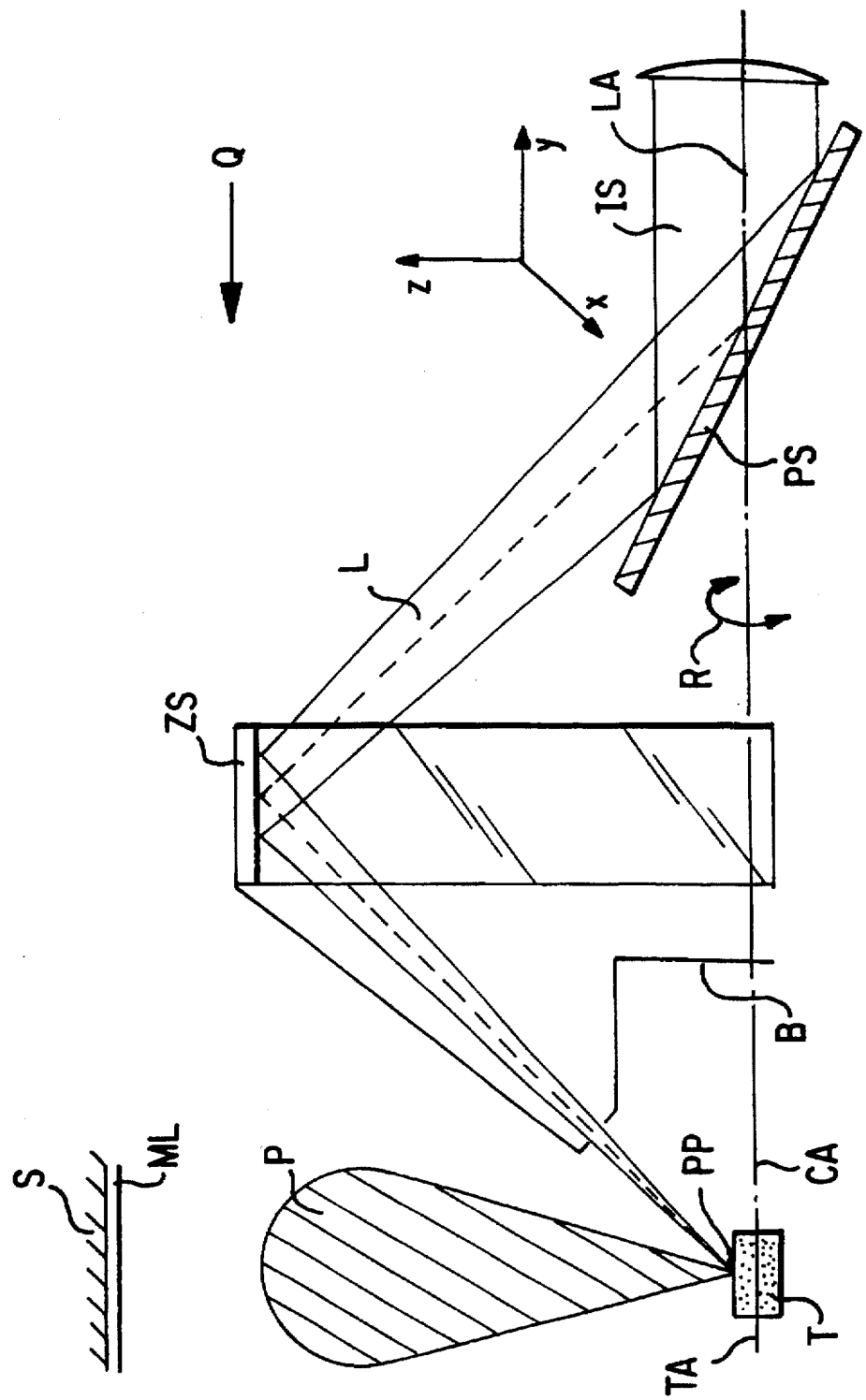
FIG. 2 is a schematic side view of the apparatus for performing the first embodiment of the method shown in FIG. 1 with additional parts.
Figure 4:
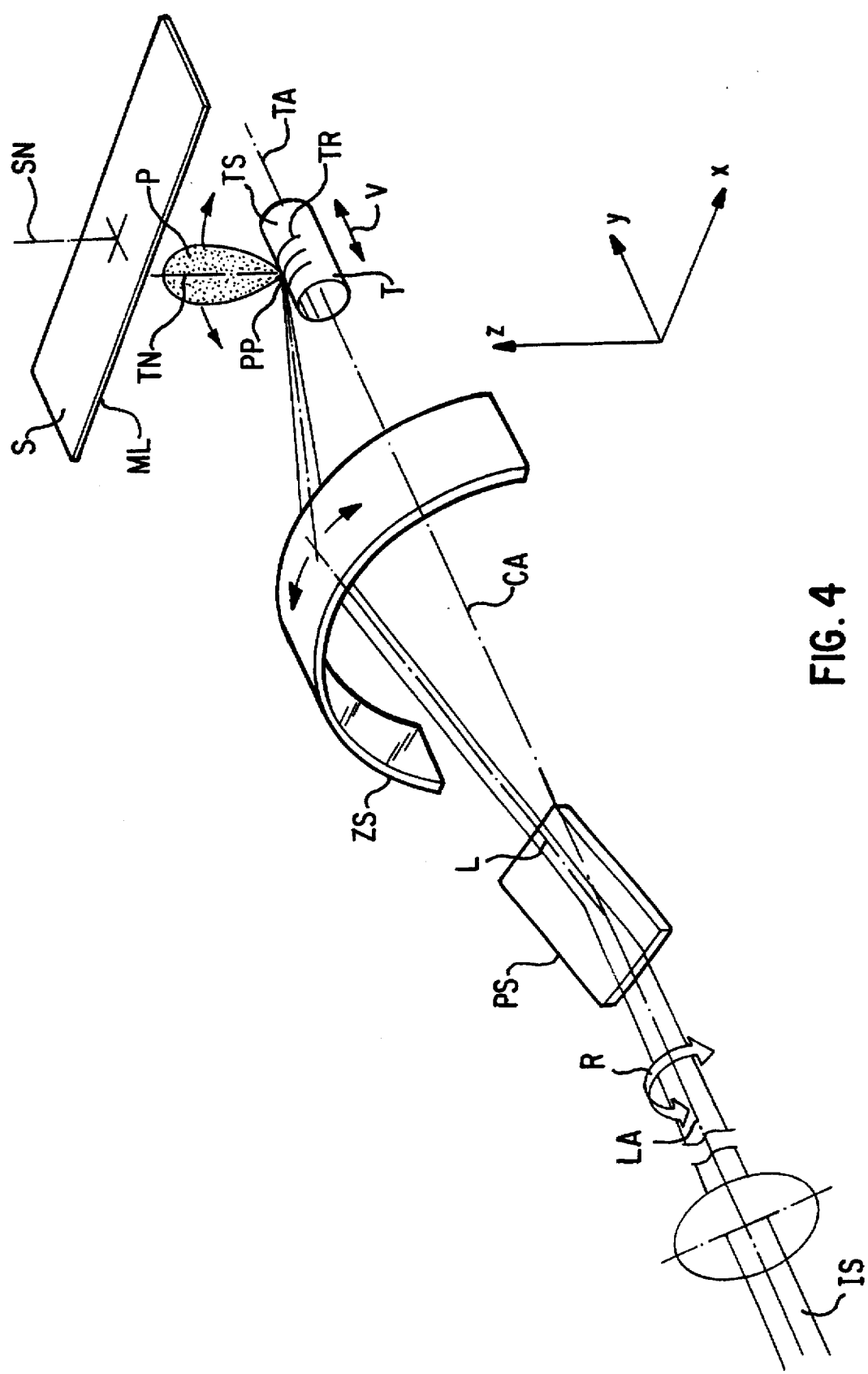
FIG. 4 is a perspective view illustrating the embodiment of FIGS. 1 and 2.

A method according to the invention for providing a thin layer on a substrate having a uniform thickness by laser pulse vapor deposition (LPVD) is shown in FIGS. 1, 2 and 4. FIG. 1 is an end view of the device shown in FIG. 2, viewed in the direction of arrow Q of FIG. 2. Some elements of FIG. 2 have been omitted from FIG. 1 for purposes of clarity.

A metal layer ML is to be deposited on a planar substrate S having, for example, the dimensions 70 mm×20 mm, the required variations in layer thickness over the entire surface being between 1 to 10 %. This substrate S is spaced several centimeters from a cylindrical target T having a diameter and a length of 10 mm in each instance. The transverse axis of the substrate S is directed in the same direction as the cylinder axis TA of the target T. A plasma plume P propagating in a radial direction (a radial direction meaning along a radius of the cylindrical target T) from the position PP on the target surface TS can brush over the entire substrate S surface at maximum intensity.

Prior to performing the laser pulse vapor deposition the target T and substrate S are positioned so that respective surface normal lines TN, SN of the target surface TS and substrate S are on a straight line and the pulsed laser beam L is focussed on the center of the target T. As best seen in FIG. 2, the axis LA of the pulsed laser beam L substantially coincides with the cylinder axis TA of the target T.

A cylindrical mirror ZS having a reflective interior surface is provided between the target T and an initial portion IS of the laser beam L. The cylindrical mirror ZS has a mirror axis CA that is substantially coincident with the axis LA of the laser beam L. A plane reflective mirror PS is positioned between the cylindrical mirror ZS and an initial path section IS of the pulsed laser beam L. This plane reflection mirror is tilted at an angle to the laser beam LA so as to deflect the laser beam L to the reflective interior surface of the cylindrical mirror and from there to the cylindrical target T. This tilting is best shown in FIG. 2. The plane reflective mirror PS is also rotatable about the laser beam axis LA (in the direction of arrows R) to move the pulsed laser beam L circumferentially along the reflective interior surface of the cylindrical mirror ZS so as to move the focussed laser beam along a track TR on the curved surface TS of the target T. The movement of the pulsed laser beam L on the reflective interior surface of the cylindrical mirror ZS and accordingly over the curved surface TS of the target T is caused by step-by-step rotation of the plane mirror PS about the laser beam axis LA over a rotation angle α in synchronization with the pulse frequency of the pulsed laser beam L. The amount of rotation per step is 1.7 degrees when the laser beam L is focussed on a center of the target T in the preferred embodiment illustrated in FIGS. 1, 2 and 4. The angular step size is reduced in proportion to $\cos^2 \alpha$ as the total amount of rotation from the center position increases. The maximum rotating angle $\alpha_m$ is 38.5°. Accordingly, approximately 70 pulses per track TR result during deflection of the beam toward either side from the center position. Other laser beam cutting tracks are formed when the target is displaced in the Y direction (as indicated by arrow V in FIG. 4) by ΔY=0.5 mm for each step in the Y direction. A total of seventeen tracks TR are formed in a target which has a length of about 10 mm. To avoid a strong coating of stray particles on the cylindrical mirror ZS, this mirror ZS is protected by appropriately positioning a diaphragm B having a slit for passage of the focussed pulsed laser beam L. The layer ML deposited on the substrate S by the plasma plume P generated according to this method has a variation in layer thickness of approximately 5 %. For simplicity the diaphragm B, the plume P and the lens for focussing the laser beam have been omitted from FIG. 1 but are shown in FIG. 2.

Figure 6:
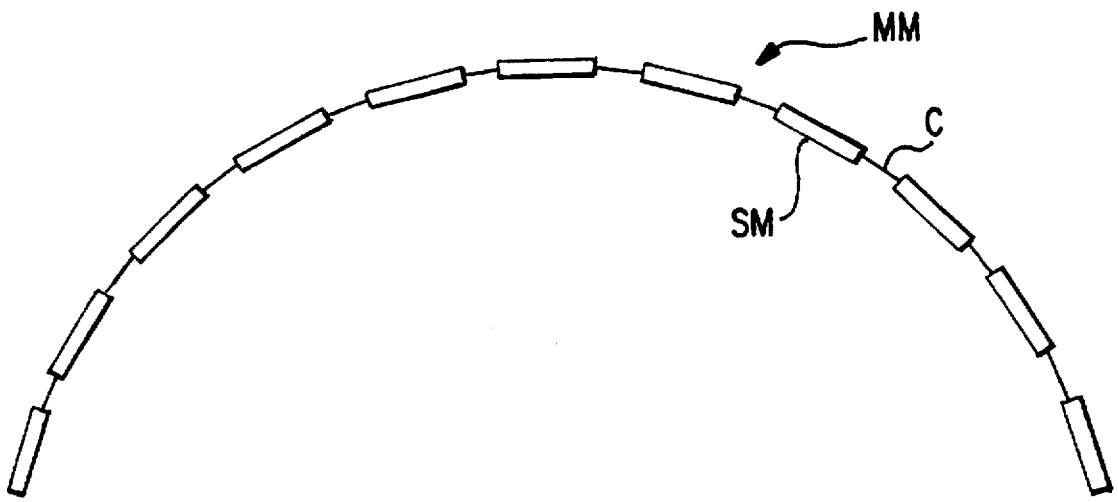
FIG. 6 is a side view of another embodiment of a mirror to be used in the embodiment of FIG. 1 instead of the cylindrical mirror.
Figure 7:
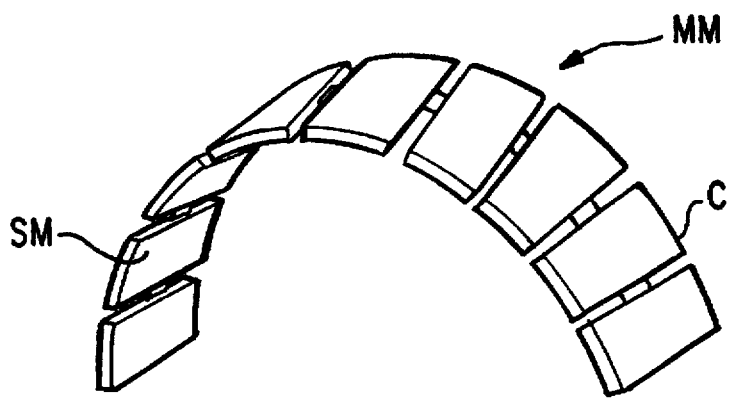
FIG. 7 is a perspective view of the mirror of FIG. 6.

Instead of the cylindrical mirror ZS used in the embodiment of FIGS. 1, 2 and 4, another embodiment of the invention uses a mirror that has a plurality of plane reflective mirrors SM that are connected together in a cylindrical or half-cylindrical manner. An exemplary embodiment is illustrated in FIGS. 6 and 7.

The plane reflective mirrors SM are connected together by connectors C to form the mirror MM that presents a plurality of plane reflective surfaces. The overall effect is the same as provided by the cylindrical mirror ZS, but a diaphragm with a slit is not needed with this embodiment to protect the mirror MM from coating from stray particles.

Although two exemplary embodiments of mirrors have been described, other mirror types can be used without departing from the spirit and scope of the present invention.

Figure 3:
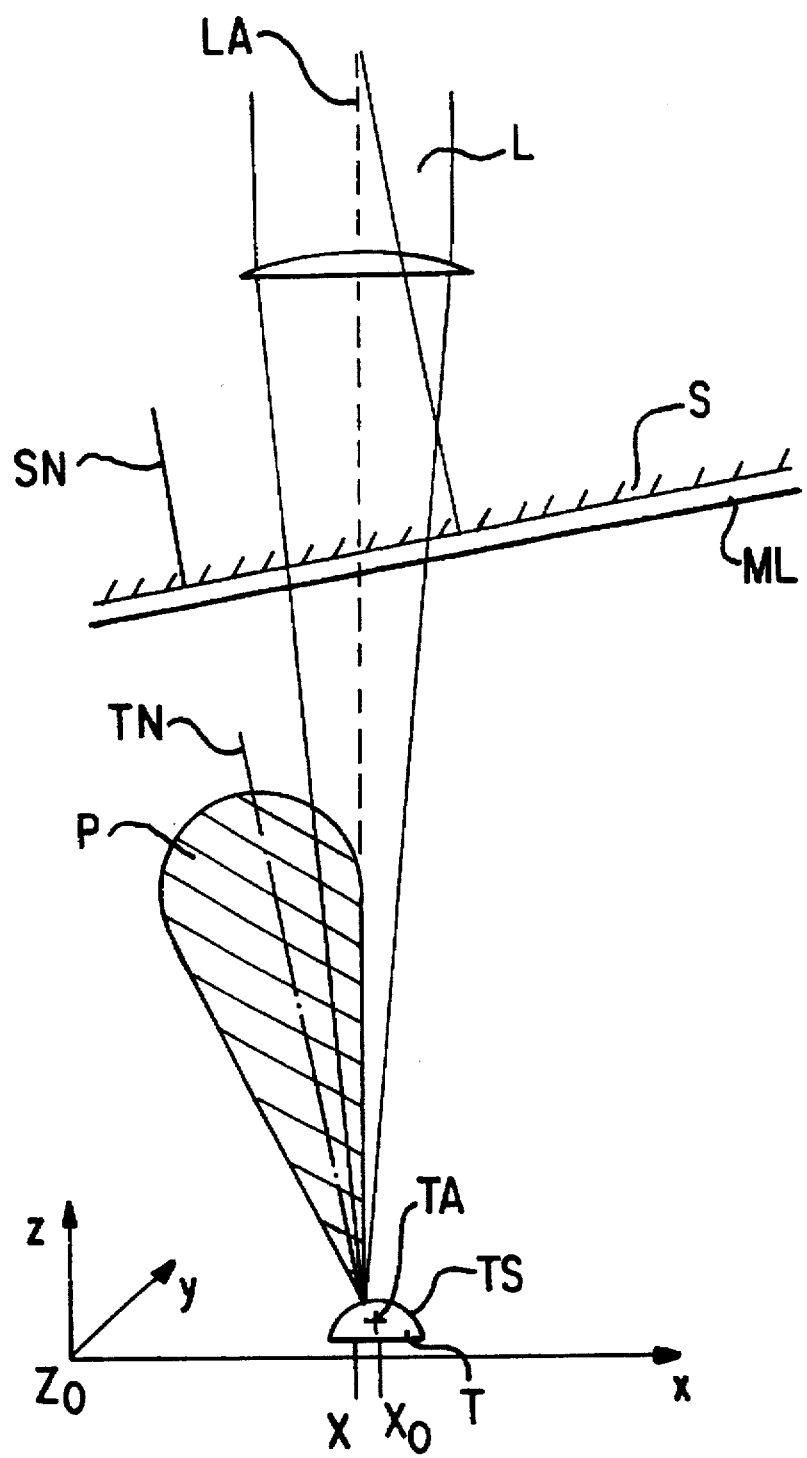
FIG. 3 is a schematic end view of an apparatus for performing the method of depositing a thin layer by laser pulse vapor deposition according to the invention.

A third embodiment of the method according to the invention for providing a thin layer on a substrate having a uniform thickness by laser pulse vapor deposition (LPVD) is shown in FIG. 3.

A metal layer ML is to be deposited on a planar substrate S having, for example the dimensions 70 mm×20 mm, the difference in the layer thickness over the entire surface being between 1 to 10 %. This substrate S is spaced several centimeters from a cylindrical target T having a diameter and a length of 10 mm in each instance. The transverse axis of the substrate S is directed in the same direction as the cylinder axis CA of the target. The plasma plume P propagates in a radial direction (a radial direction meaning along a radius of the cylindrical target T) from the target surface TS and brushes over the entire substrate S surface at maximum intensity.

Prior to performing the pulsed laser vapor deposition, the target T and the substrate S are positioned so that a surface normal line TN of the target surface TS and a surface normal line SN of the substrate S are on a straight line. This alignment of the normal lines TN, SN, is illustrated in FIG. 3, but not FIG. 5.

The pulsed laser beam L is focussed on the target T. At the beginning of the laser pulse vapor deposition the laser beam L is focussed on the center $X_0$ of the curved target surface TS to generate a plasma plume P. The plasma plume P is moved over a track $TR_1$, $TR_2$, or $TR_3$ on the curved surface TS of the target T. This movement is accomplished by moving the focussed pulsed laser beam L across the target surface TS by step-by-step displacement of the target T along the track or in the X direction in synchronism with the pulse frequency of the pulsed laser beam. The amount of displacement T per step in the X direction is about 0.2 mm in the vicinity of the center position $X_0$. The step size $\Delta X$ is reduced in proportion to $\cos^2\alpha$ as the displacement from the center position $X_0$ increases where, $\alpha=\arcsin [x/r]$ (r=radius of the target T) as seen from FIG. 5. This provides a nonlinear movement of the target T. In the illustrated embodiment, the maximum displacement from the center position is 4 mm. To further improve the uniformity of the layer thickness, the laser pulse frequency can be doubled for displacements greater than 2 mm from the center position and a tracking of the target T can take place in the Z direction. The next track TR is adjusted by displacing the target T in the Y direction by $\Delta Y=0.5$ mm. Accordingly, a maximum of 17 tracks can be formed in this embodiment for a target having a length of 10 mm. The layer deposited on the substrate S according to this second embodiment of the method has a layer thickness variation of about 5%. In this embodiment, the substrate S is swiveled synchronously with the movement of the pulsed laser beam L on the curved surface TS of the target T. A swiveled position of the substrate S and its relation to the plasma plume P generated at a position X at a distance from center position $X_0$ is shown in FIG. 3.

In an alternative embodiment, instead of moving the target T in a nonlinear manner, the energy density of the laser beam L is correspondingly changed as a function of the displacement of the target T from the center position $X_0$, while maintaining a linear movement of the target T. Either the pulse energy of the laser beam L or the distance between the lens and the target T is changed as a function of the linear displacement of the target T in the X direction. The distance between the lens and the target T can be changed simply by moving the target T in the Y direction.

Figure 5:
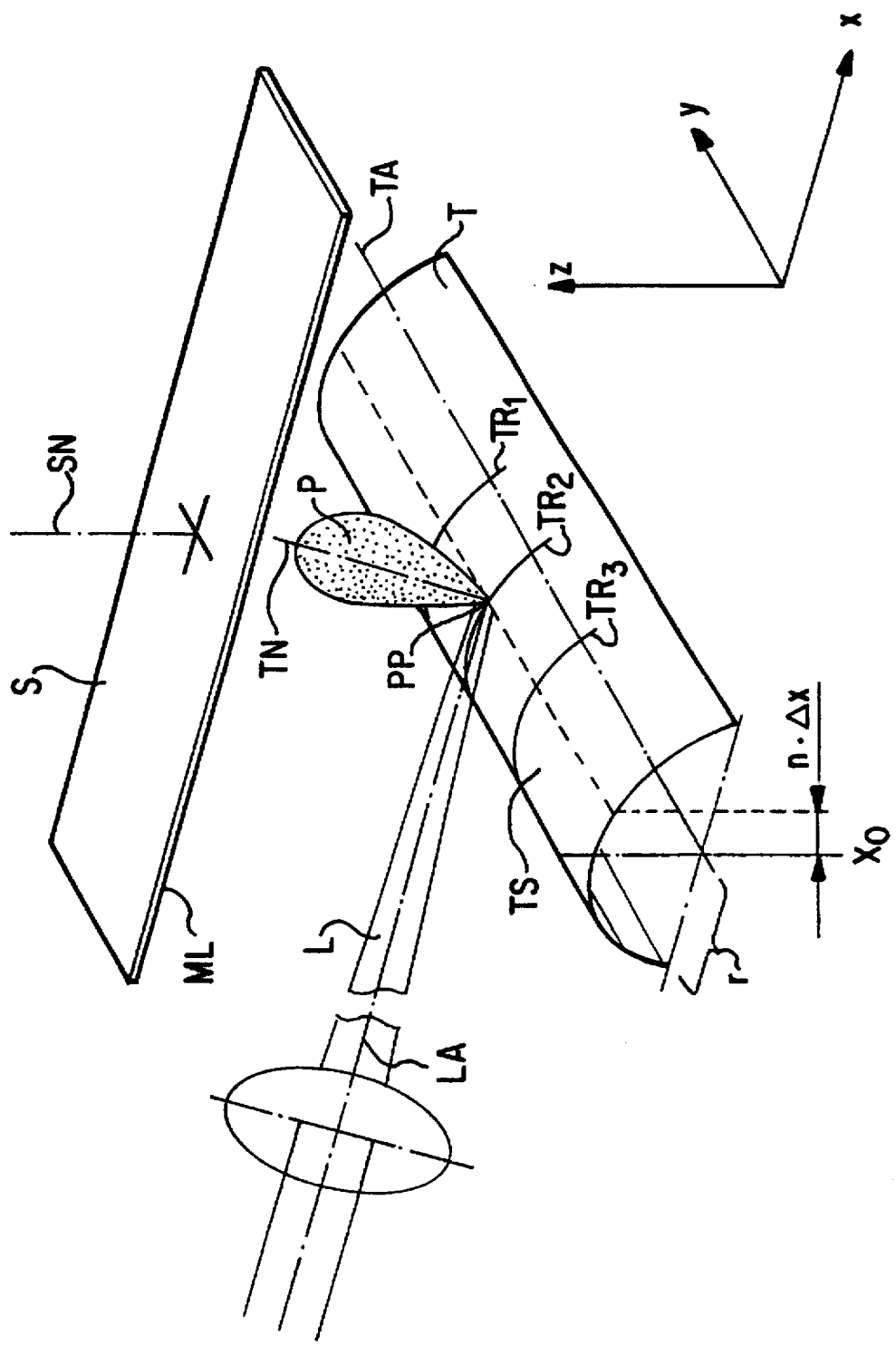
FIG. 5 is a perspective view illustrating the embodiment of FIG. 3.

As shown by Arrow H in FIG. 5, in certain embodiments of the invention, the target T is movable along the Z-axis as well as the X-axis and the Y-axis. Also, in certain embodiments, the substrate S is not moved or rotated, and only the target is moved.

Figure 8:
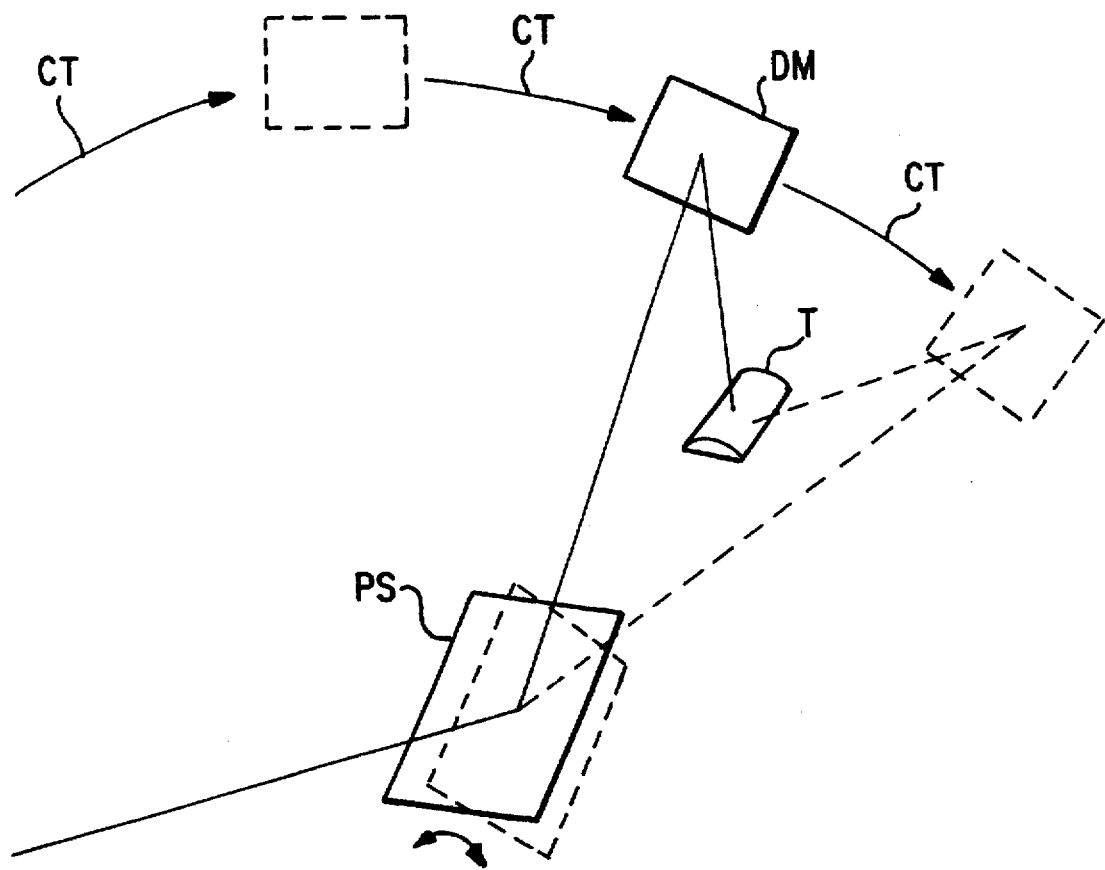
FIG. 8 is a schematic perspective view of another embodiment of the invention.

In a further alternative embodiment shown in FIG. 8, a single displaceable plane mirror DM is used instead of the cylindrical mirror ZS of FIG. 4 or the mirror MM of FIG. 7. In order to provide the same functionality as the cylindrical mirror ZS or the mirror MM, the mirror DM is displaced along a curved track CT to different positions (shown in phantom lines) mirror PS. This allows the laser beam to be deflected to irradiate the different target surface areas from different respective angles. The means for synchronously moving the displaceable mirror DM with the rotation of the plane reflective mirror PS is easily arranged by one of ordinary skill in the art and is therefore not illustrated in FIG. 8 so as not to obscure the invention.

Although the invention has been described and illustrated in detail, it is to be clearly understood that the same is by way of illustration and example and is not to be taken by way of limitation. The spirit and scope of the present invention are to be limited only by the terms of the appended claims.

What is claimed is:

1. Apparatus for depositing a layer on a substrate by laser pulse vapor deposition, comprising:

a target which has a longitudinally extending target axis and a curved target surface extending at least partially around the target axis;

a laser beam source for projecting a pulsed laser beam;

first and second mirrors disposed in series between the laser beam source and the curved target surface, said first and second mirrors being arranged to deflect the laser beam from the first mirror to the second mirror to the curved target surface where a plasma plume of target material is produced in response to the laser beam impinging on the curved target surface; and a substrate positioned adjacent the target such that a coating surface of the substrate is substantially parallel to said target axis and such that the plasma plume applies a coating layer of target material to the coating surface;

wherein said first mirror has a planar reflective surface which is rotatable about a first mirror axis, which said first mirror axis is in the planar reflective surface and is obliquely inclined with respect to the target axis, wherein said second mirror has a reflective second mirror surface means which is either movable along an arc or configured as the arc, said arc extending at least partially circumferentially around the target axis, and wherein means are provided for rotating said first mirror in successive angular steps about the first mirror axis so as to move the laser beam along successive points on said arc, said laser beam being deflected from said successive points by said second mirror surface means to impinge upon respective corresponding successive points on said curved target surface, said corresponding successive points being located on a target surface arc which extends through a central point of said curved target surface located nearest said coating surface, said target surface arc being disposed in a plane which is perpendicular to said target axis and which contains said central point, said laser beam impinging upon each of said corresponding successive points to produce a respective plasma plume of target material which propagates in a substantially radial direction from said target to said coating surface in order to produce a constant thickness of plasma plume coating over the coating surface of the substrate.

2. Apparatus according to claim 1, wherein said second mirror surface means comprises a continuous mirror surface which is configured as said arc.

3. Apparatus according to claim 1, wherein said second mirror surface means is a plane surface mirror which is moved along said arc synchronously with said first mirror as the first mirror is rotated in successive angular steps about the first mirror axis.

4. Apparatus according to claim 1, wherein said second mirror surface means includes a plurality of planar mirror surface members configured as said arc.

5. Apparatus according to claim 1, wherein step sizes of said successive angular steps are incrementally decreased as the laser beam is impinged upon said corresponding successive points located further away from said central point.

6. Apparatus according to claim 5, wherein said successive angular steps are incrementally decreased in proportion to $\cos^2\alpha$, $\alpha$ being an angular rotation of the first mirror with respect a central position at which the laser beam is impinged upon said central point.

7. Apparatus according to claim 6, wherein an initial angular step size, in which the first mirror is rotated from said central point to a first of said successive points on said arc, is 1.7°.

8. Apparatus according to claim 7, wherein a maximum rotating angle of the first mirror is approximately 38.5°.

9. Apparatus according to claim 1, further comprising means for sequentially moving the target along the target axis to a plurality of target positions, and wherein said coating layer is applied at each of said target positions.

10. Apparatus according to claim 6, further comprising means for sequentially moving the target along the target axis to a plurality of target positions, and wherein said coating layer is applied at each of said target positions.

11. Apparatus according to claim 1, wherein the pulsed laser beam is projected from a laser beam source in an initial laser beam path which is substantially coincident with the target axis.

12. Apparatus according to claim 1, wherein said first mirror axis is substantially coincident to said target axis.

13. Apparatus for depositing a thin layer on a substrate by laser pulse vapor deposition, comprising:

a target which has a longitudinally extending target axis, a lateral axis extending perpendicular to said target axis, and a curved target surface extending at least partially around the target axis;

a laser beam source for projecting a pulsed laser beam onto the curved target surface where a plasma plume of target material is produced in response to the laser beam impinging on the curved target surface;

a substrate positioned adjacent the target such that the plasma plume applies a coating layer of target material to a coating surface of the substrate;

means for displacing said target in successive steps along said lateral axis such that the laser beam impinges upon the curved target surface along respective successive points of a target surface arc, said laser beam impinging upon each of said successive points to produce a respective plasma plume of target material which propagates in a substantially radial direction from the target to the coating surface, means for swivelling said substrate synchronously with said successive steps such that a respective normal line of said coating surface is aligned with each said respective plasma plume and means for controlling said target displacement in order to produce a constant thickness of plasma plume coating over the coating surface of the substrate.

14. Apparatus according to claim 13, wherein the target displacement is controlled such that a step size between said successive steps is maximum when the laser beam impinges upon a central position of the curved target surface which is located nearest said coating surface, the step size being non-linearly reduced as the location of the laser beam impingement on the curved target surface is moved further from the central position.

15. Apparatus according to claim 14, wherein the step size is reduced in proportion to $\cos^2\alpha$ as the displacement x of the location of laser beam impingement from the central position $X_0$ increases, where $$\alpha = \arcsin [x/r]$$

and r=the radius of the curved target surface.

16. Apparatus according to claim 15, wherein the maximum displacement x from the central position $X_0$ is 4 mm, and wherein the target has a radius r of approximately 10 mm.

17. Apparatus according to claim 13, wherein said target displacement is controlled such that the target is displaced in a linear manner from a central position of the curved target surface while an energy density of the laser beam impinging on the curved target surface is increased as the location of laser beam impingement on the curved target surface is moved further from the central position.

18. Apparatus according to claim 13, further comprising means for sequentially moving the target along the target axis to a plurality of target positions, and wherein said coating layer is applied at each of said target positions.

19. Apparatus according to claim 14, further comprising means for sequentially moving the target along the target axis to a plurality of target positions, and wherein said coating layer is applied at each of said target positions.

20. Apparatus according to claim 15, further comprising means for sequentially moving the target along the target axis to a plurality of target positions, and wherein said coating layer is applied at each of said target positions.

21. Apparatus according to claim 16, further comprising means for sequentially moving the target along the target axis to a plurality of target positions, and wherein said coating layer is applied at each of said target positions.

22. Apparatus according to claim 13, wherein the pulsed laser beam is projected from a laser beam source in an initial laser beam path which is substantially coincident with the target axis.

* * * * *